US012125719B2

(12) United States Patent
Liao et al.

(10) Patent No.: US 12,125,719 B2
(45) Date of Patent: Oct. 22, 2024

(54) CHIP-TRANSFERRING SYSTEM AND CHIP-TRANSFERRING METHOD

(71) Applicant: Skiileux Electricity Inc., Taoyuan (TW)

(72) Inventors: Chien-Shou Liao, New Taipei (TW); Te-Fu Chang, Taichung (TW); Sheng-Che Huang, Taoyuan (TW); Yu-Min Huang, Taoyuan (TW)

(73) Assignee: Skilleux Electricity Inc., Taoyuan (TW)

( * ) Notice: Subject to any disclaimer, the term of this patent is extended or adjusted under 35 U.S.C. 154(b) by 609 days.

(21) Appl. No.: 17/376,136

(22) Filed: Jul. 14, 2021

(65) Prior Publication Data
US 2022/0020619 A1 Jan. 20, 2022

(30) Foreign Application Priority Data
Jul. 15, 2020 (TW) .................................. 109123854

(51) Int. Cl.
*H01L 21/67* (2006.01)
(52) U.S. Cl.
CPC .. *H01L 21/67103* (2013.01); *H01L 21/67144* (2013.01); *H01L 21/67265* (2013.01);
(Continued)
(58) Field of Classification Search
CPC ......... H01L 21/67098; H01L 21/67103; H01L 21/67132; H01L 21/67144;
(Continued)

(56) References Cited

U.S. PATENT DOCUMENTS

2009/0127315 A1* 5/2009 Okita ..................... H01L 24/81
228/9
2019/0164930 A1 5/2019 Guo et al.
(Continued)

FOREIGN PATENT DOCUMENTS

CN 202758888 2/2013
CN 109256351 1/2019
(Continued)

OTHER PUBLICATIONS

WO 2009125609 machine translation FIT database (Year: 2024).*
"Office Action of China Counterpart Application", issued on Dec. 7, 2023, p. 1-p. 12.

*Primary Examiner* — Jeffrey T Carley
*Assistant Examiner* — Joshua D Anderson
(74) *Attorney, Agent, or Firm* — JCIPRNET

(57) ABSTRACT

A chip-transferring system and a chip-transferring method are provided. The chip-transferring system includes a substrate-carrying module for carrying a chip-carrying structure, a chip-transferring module, and a system control module. The chip-carrying structure includes a circuit substrate for carrying a plurality of conductive materials, a plurality of micro heaters, and a micro heater control chip. The chip-transferring module is configured for transferring a chip onto two corresponding ones of the conductive materials, and the chip-transferring module includes a motion sensing chip. When chip movement information of the chip that is provided by the motion sensing chip is transmitted to the system control module, the micro heater control chip is configured to control a corresponding one of the micro heaters to start or stop heating the two corresponding conductive materials by control of the system control module according to the chip movement information of the chip.

9 Claims, 12 Drawing Sheets

(52) U.S. Cl.
CPC .... *Y10T 29/49144* (2015.01); *Y10T 29/53178* (2015.01); *Y10T 29/53191* (2015.01)

(58) Field of Classification Search
CPC ......... H01L 21/67253; H01L 21/67265; H01L 21/6835; H01L 21/6836; H01L 2221/68318; H01L 2221/68354; H01L 2221/68372; H01L 24/75; H01L 24/81; H01L 2224/81203; H01L 2224/81234; H01L 2224/81238; H01L 2224/759; H01L 2224/75901; H05K 3/34; H05K 3/341; H05K 3/3431; H05K 3/3436; H05K 3/3494; H05K 13/0069; H05K 13/0408; H05K 13/0409; H05K 13/046; H05K 13/0465; H05K 13/08; H05K 13/0817; H05K 13/082; H05K 13/0882; H05K 13/0885; Y10T 29/49144; Y10T 29/5313; Y10T 29/53178; Y10T 29/53191
See application file for complete search history.

(56) References Cited

U.S. PATENT DOCUMENTS

| | | | |
|---|---|---|---|
| 2019/0237445 A1 | 8/2019 | Huska et al. | |
| 2019/0319064 A1* | 10/2019 | Liao | H01L 27/156 |
| 2020/0152692 A1* | 5/2020 | Liao | H01L 27/156 |
| 2021/0118945 A1* | 4/2021 | Liao | H01L 25/0753 |
| 2021/0320225 A1* | 10/2021 | Liao | H01L 25/0753 |
| 2021/0384042 A1* | 12/2021 | Qu | H01L 21/67092 |
| 2022/0020723 A1* | 1/2022 | Liao | H01L 23/345 |

FOREIGN PATENT DOCUMENTS

| | | | |
|---|---|---|---|
| CN | 111128813 | 5/2020 | |
| CN | 111146132 | 5/2020 | |
| CN | 111293066 | 6/2020 | |
| JP | S6255947 | 3/1987 | |
| JP | H02226737 | 9/1990 | |
| JP | H05198621 | 8/1993 | |
| KR | 1020190012112 A | 2/2019 | |
| KR | 20190107519 | 9/2019 | |
| TW | 201642363 A | 12/2016 | |
| TW | I698949 | 7/2020 | |
| WO | WO-2009125609 A1 * | 10/2009 | ............ H01L 24/16 |

* cited by examiner

CHIP-TRANSFERRING SYSTEM AND CHIP-TRANSFERRING METHOD

CROSS-REFERENCE TO RELATED PATENT APPLICATION

This application claims the benefit of priority to Taiwan Patent Application No. 109123854, filed on Jul. 15, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transferring system and a transferring method, and more particularly to a chip-transferring system and a chip-transferring method.

BACKGROUND OF THE DISCLOSURE

In the related art, a light-emitting diode (LED) chip can be transferred from a carrier to another carrier by suctioning of a nozzle or pushing of a push pin.

SUMMARY OF THE DISCLOSURE

In response to the above-referenced technical inadequacy, the present disclosure provides a chip-transferring system and a chip-transferring method.

In one aspect, the present disclosure provides a chip-transferring method, which includes: carrying a chip-carrying structure, in which the chip-carrying structure includes a circuit substrate for carrying a plurality of conductive materials, a plurality of micro heaters disposed on or inside the circuit substrate, and a micro heater control chip electrically connected to the micro heaters; placing a chip on two corresponding ones of the conductive materials; providing chip movement information of the chip; controlling a corresponding one of the micro heaters to start or stop heating the two corresponding conductive materials by control of the micro heater control chip according to the chip movement information of the chip; and bonding the chip on the chip-carrying structure by heating and cooling the two corresponding conductive materials.

In another aspect, the present disclosure provides a chip-transferring system, which includes a substrate-carrying module, a chip-transferring module, and a system control module. The substrate-carrying module is configured for carrying a chip-carrying structure, and the chip-carrying structure includes a circuit substrate for carrying a plurality of conductive materials, a plurality of micro heaters disposed on or inside the circuit substrate, and a micro heater control chip electrically connected to the micro heaters. The chip-transferring module is disposed above or under the substrate-carrying module for transferring a chip onto two corresponding ones of the conductive materials, and the chip-transferring module includes a motion sensing chip. The system control module is electrically connected between the motion sensing chip and the micro heater control chip. When chip movement information of the chip that is provided by the motion sensing chip of the chip-transferring module is transmitted to the system control module, the micro heater control chip is configured to control a corresponding one of the micro heaters to start or stop heating the two corresponding conductive materials by control of the system control module according to the chip movement information of the chip.

In yet another aspect, the present disclosure provides a chip-transferring system, which includes a substrate-carrying module, a chip-transferring module, and a system control module. The substrate-carrying module is configured for carrying a chip-carrying structure, and the chip-carrying structure includes a plurality of micro heaters, and a micro heater control chip electrically connected to the micro heaters. The chip-transferring module includes a motion sensing chip. The system control module is electrically connected between the motion sensing chip and the micro heater control chip.

Therefore, in the chip-transferring system provided by the present disclosure, by virtue of "the substrate-carrying module being configured for carrying a chip-carrying structure, and the chip-carrying structure including a plurality of micro heaters, and a micro heater control chip electrically connected to the micro heaters", "the chip-transferring module including a motion sensing chip" and "the system control module being electrically connected between the motion sensing chip and the micro heater control chip", the micro heater control chip can be configured to control a corresponding one of the micro heaters to start or stop heating two corresponding conductive materials.

Furthermore, in the chip-transferring method provided by the present disclosure, by virtue of "carrying a chip-carrying structure, in which the chip-carrying structure includes a circuit substrate for carrying a plurality of conductive materials, a plurality of micro heaters disposed on or inside the circuit substrate, and a micro heater control chip electrically connected to the micro heaters", "placing a chip on two corresponding ones of the conductive materials", "providing chip movement information of the chip" and "controlling a corresponding one of the micro heaters by the micro heater control chip according to the chip movement information of the chip", the micro heater control chip can be configured to control the corresponding micro heater to start or stop heating the two corresponding conductive materials according to the chip movement information of the chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
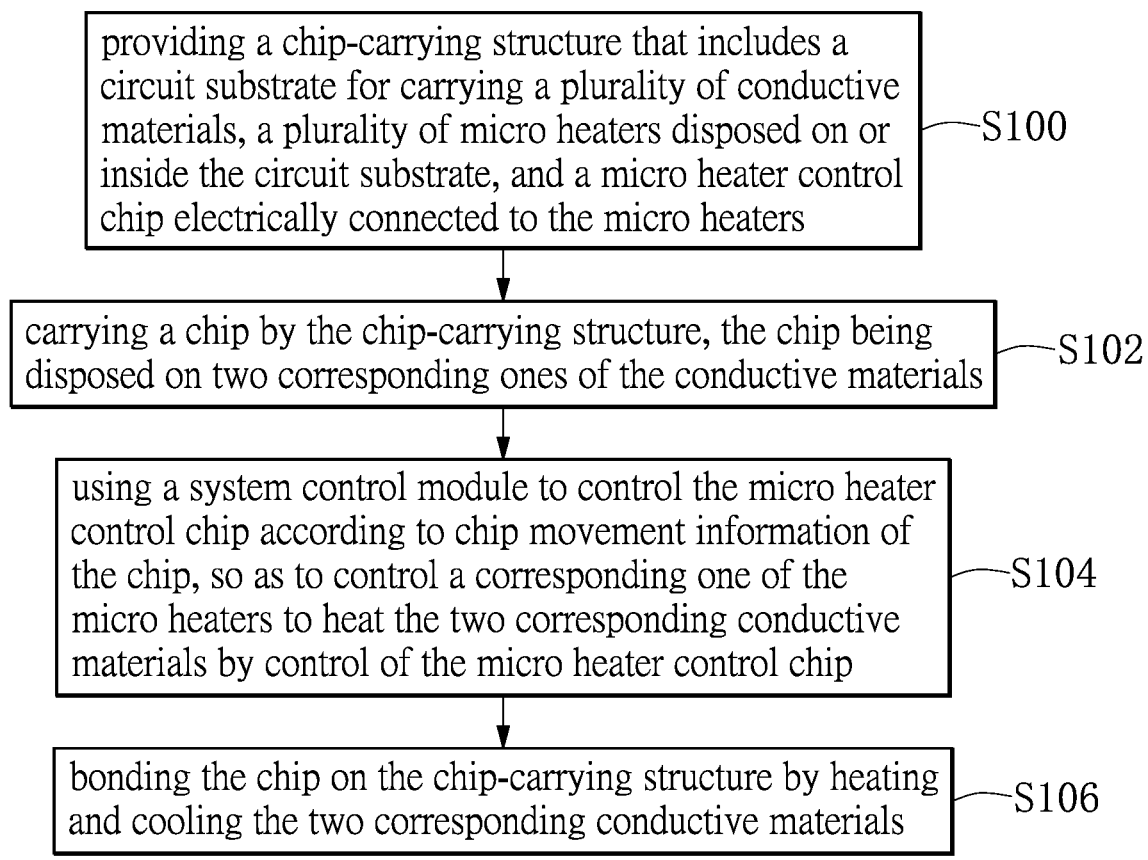
FIG. 1 is a flowchart of a chip-bonding method according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a chip-carrying structure Z including a circuit substrate 1 for carrying a plurality of conductive materials B, a plurality of micro heaters 2 disposed on or inside the circuit substrate 1, and a micro heater control chip 3 electrically connected to the micro heaters 2.

The present disclosure provides a chip-bonding method including: providing a chip-carrying structure Z, in which the chip-carrying structure Z includes a circuit substrate 1 for carrying a plurality of conductive materials B, a plurality of micro heaters 2 disposed on or inside the circuit substrate 1, and a micro heater control chip 3 electrically connected to the micro heaters 2; carrying a chip C by the chip-carrying structure Z, in which the chip C is disposed on two corresponding ones of the conductive materials B; controlling a corresponding one of the micro heaters 2 to heat the two corresponding conductive materials B by control of the micro heater control chip 3 according to chip movement information N of the chip C; and bonding the chip C on the chip-carrying structure Z by heating and cooling the two corresponding conductive materials B.

The present disclosure provides a chip-transferring system M including a substrate-carrying module M1, a chip-transferring module M2, and a system control module M3. The substrate-carrying module M1 is configured for carrying a chip-carrying structure Z, and the chip-carrying structure Z includes a plurality of micro heaters 2, and a micro heater control chip 3 electrically connected to the micro heaters 2. The chip-transferring module M2 includes a motion sensing chip M20, and the system control module M3 is electrically connected between the motion sensing chip M20 and the micro heater control chip 3.

The present disclosure provides a chip-transferring method including: carrying a chip-carrying structure Z by a substrate-carrying module M1, in which the chip-carrying structure Z includes a circuit substrate 1 for carrying a plurality of conductive materials B, a plurality of micro heaters 2 disposed on or inside the circuit substrate 1, and a micro heater control chip 3 electrically connected to the micro heaters 2; placing a chip C on two corresponding ones of the conductive materials B by a chip-transferring module M2; providing chip movement information N of the chip C by a motion sensing chip M20 of a chip-transferring module M2 to a system control module M3 that is electrically connected between the motion sensing chip M20 and the micro heater control chip 3; controlling a corresponding one of the micro heaters 2 to start or stop heating the two corresponding conductive materials B by control of the micro heater control chip 3 according to the chip movement information N of the chip C; and bonding the chip C on the chip-carrying structure Z by heating and cooling the two corresponding conductive materials B.

First Embodiment

Figure 2:
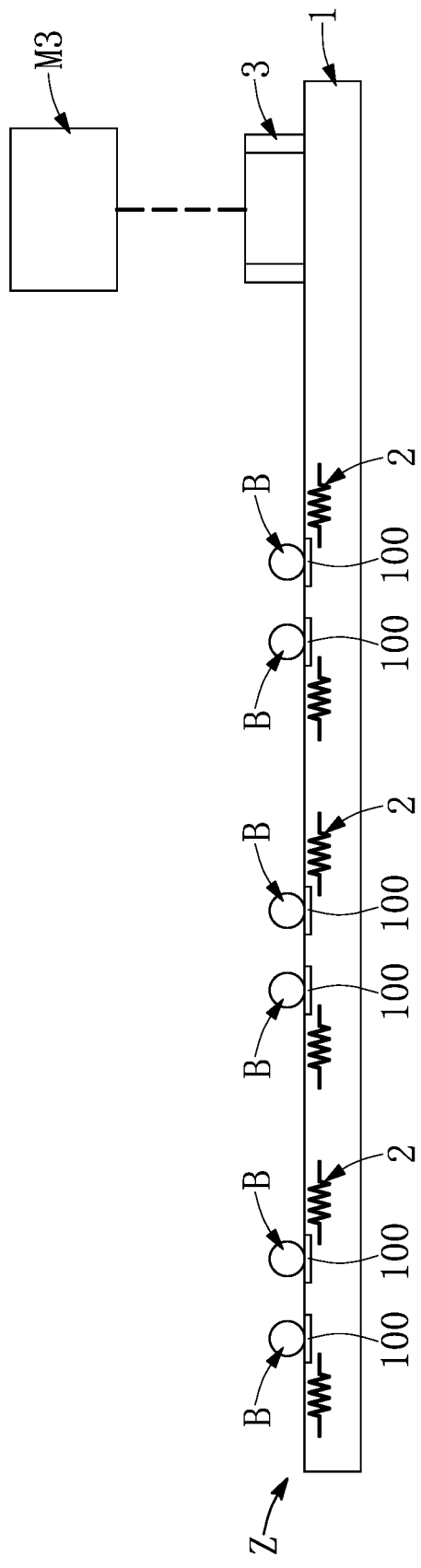
FIG. 2 is a schematic side view of a chip-carrying structure according to the first embodiment of the present disclosure.
Figure 3:
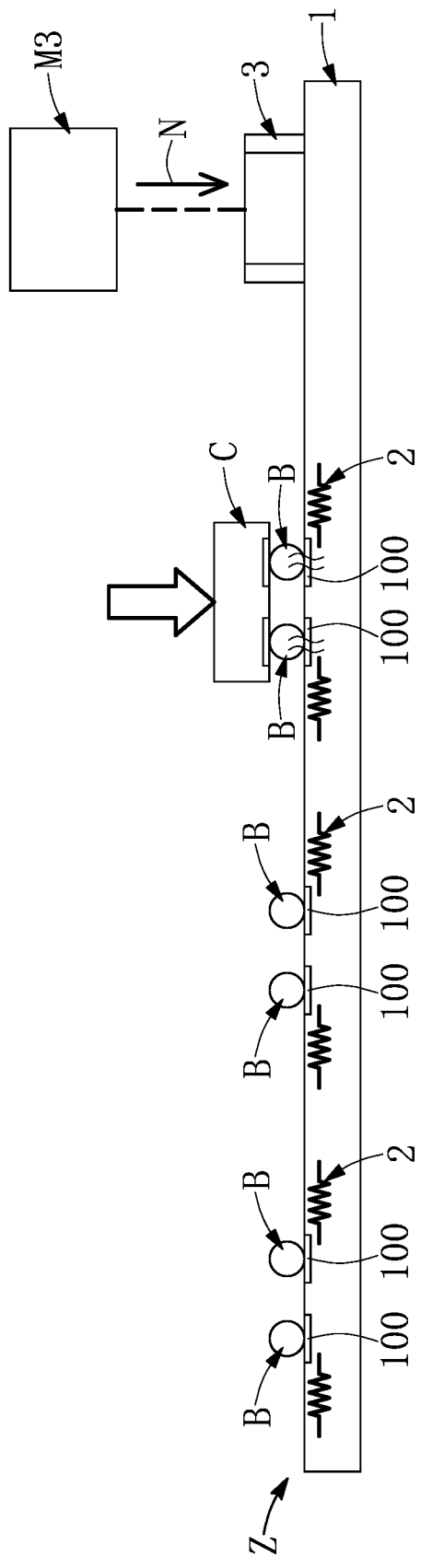
FIG. 3 is a schematic side view of the chip-carrying structure for carrying a chip according to the first embodiment of the present disclosure.

Referring to FIG. 1 to FIG. 5, a first embodiment of the present disclosure provides a chip-bonding method including: firstly, referring to FIG. 1 and FIG. 2, providing a chip-carrying structure Z that includes a circuit substrate 1 for carrying a plurality of conductive materials B, a plurality of micro heaters 2 disposed on or inside the circuit substrate 1, and a micro heater control chip 3 electrically connected to the micro heaters 2 (step S100); next, referring to FIG. 1 and FIG. 3, carrying a chip C by the chip-carrying structure Z, the chip C being disposed on two corresponding ones of the conductive materials B (step S102); then, referring to FIG. 1 and FIG. 3, using a system control module M3 to control the micro heater control chip 3 according to chip movement information N (i.e., information about the chip C that has been moved) of the chip C, so as to control a corresponding one of the micro heaters 2 to heat the two corresponding conductive materials B by control of the micro heater control chip 3 according to the chip movement information N of the chip C (step S104); and referring to FIG. 1 and FIG. 3, bonding the chip C on the chip-carrying structure Z by heating and cooling the two corresponding conductive materials B (step S106).

For example, as shown in FIG. 2, the circuit substrate 1 includes a plurality of conductive pads 100 for respectively carrying the conductive materials B, and each of the micro heaters 2 is adjacent to two corresponding ones of the conductive pads 100, so that two conductive materials B that are respectively disposed on the two corresponding conductive pads 100 can be heated by the corresponding micro heater 2. In addition, the conductive material B can be a solder ball, solder paste or any other kind of solder material, and the chip C can be a light-emitting diode (LED) chip or an integrated circuit (IC) chip. However, the aforementioned description is merely an example, and is not meant to limit the scope of the present disclosure.

Figure 4:
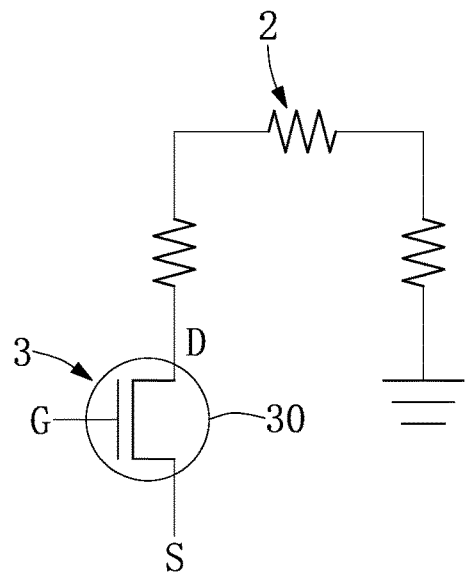
FIG. 4 is a schematic side view of a CMOS control circuit of the chip-carrying structure electrically connected to a plurality of micro heaters according to the first embodiment of the present disclosure.

For example, referring to FIG. 3 and FIG. 4, the micro heater control chip 3 includes a plurality of complementary metal-oxide-semiconductor (CMOS) control circuits 30 respectively and electrically connected to the micro heaters 2, and the CMOS control circuit 30 has a source S, a drain D, and a gate G. In addition, each of the micro heaters 2 can be turned on (i.e., the current can pass through the micro heater 2) to heat the two corresponding conductive materials B by a corresponding one of the CMOS control circuits 30, or can be turned off (i.e., the current cannot pass through the micro heater 2) to cool the two corresponding conductive materials B by a corresponding one of the CMOS control circuits 30. That is to say, each of the CMOS control circuits 30 can be configured to control the micro heater control chip 3 to determine whether the current can pass through the corresponding micro heater 2. When the CMOS control circuit 30 is turned on, the current can pass through the CMOS control circuit 30 and transmit to the corresponding micro heater 2, so that the corresponding micro heater 2 can be turned on (can be heated) so as to heat the two corresponding conductive materials B. When the CMOS control circuit 30 is turned off, the current cannot pass through the CMOS control circuit 30 and transmit to the corresponding micro heater 2, so that the corresponding micro heater 2 can be turned off (cannot be heated) so as to cool the two corresponding conductive materials B. However, the aforementioned description is merely an example, and is not meant to limit the scope of the present disclosure.

For example, as shown in FIG. 3, the system control module M3 can be configured to control the micro heater control chip 3 to turn on or turn off the micro heater 2 (or turn on or turn off the micro heaters 2 individually) according to the chip movement information N of the chip C. That is to say, when the system control module M3 is configured to control the micro heater control chip 3 to turn on the micro heater 2 according to the chip movement information N (the chip movement information N is a signal generated after moving the chip C) of the chip C, the micro heater 2 can be configured to start heating the two corresponding conductive materials B. When the system control module M3 is configured to control the micro heater control chip 3 to turn off the micro heater 2 according to the chip movement information N (the chip movement information N is a signal generated after moving the chip C) of the chip C, the micro heater 2 can be configured to stop heating the two corresponding conductive materials B so as to cool the two corresponding conductive materials B. It should be noted that each of the micro heaters 2 has a predetermined resistance value (a predetermined impedance value), and a working current or a working voltage (or the working current and the working voltage) received by the micro heater 2 can be adjusted by the micro heater control chip 3 according to the predetermined resistance value of the micro heater 2, so that heating temperatures (or heating effects) respectively provided by the micro heaters 2 are the same. Alternatively, the micro heater control chip 3 can be configured to control the micro heater 2 to provide a predetermined heating temperature or heating effect. However, the aforementioned description is merely an example, and is not meant to limit the scope of the present disclosure.

Figure 5:
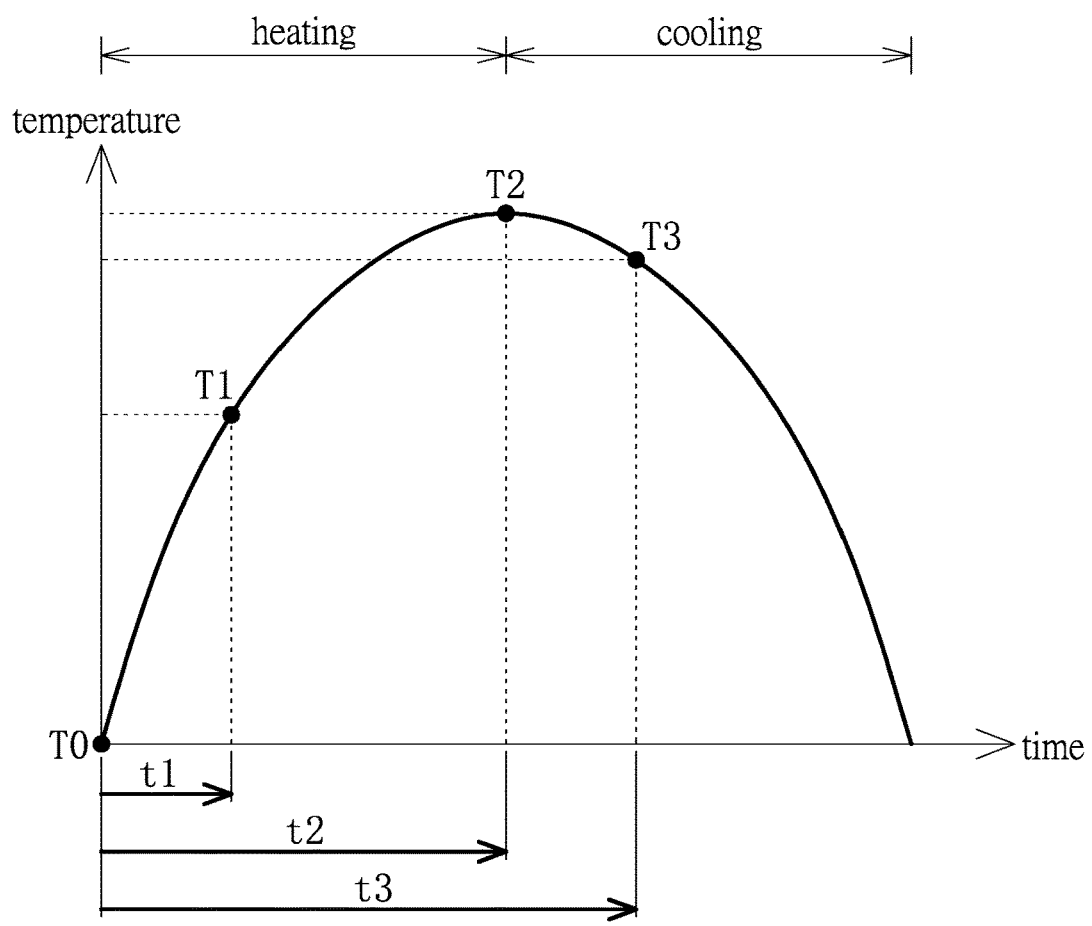
FIG. 5 is a curve diagram showing a relationship between a heating (or cooling) temperature and a heating (or cooling) time of the micro heater according to the first embodiment of the present disclosure.

For example, referring to FIG. 3 and FIG. 5, the micro heater 2 can provide different heating or cooling embodiments as follows:

1. When the chip C is transferred to the two corresponding conductive materials B, the micro heater control chip 3 can be configured to control the corresponding micro heater 2 to start heating the two corresponding conductive materials B. That is to say, the corresponding micro heater 2 can be heated simultaneously from a start heating temperature T0 when the chip C is transferred to the two corresponding conductive materials B, so that the two corresponding conductive materials B are heated from the start heating temperature T0 (such as 0° C.). However, the aforementioned description is merely an example, and is not meant to limit the scope of the present disclosure.

2. When the chip C is transferred to the two corresponding conductive materials B, the micro heater control chip 3 can be configured to control the corresponding micro heater 2 to heat the two corresponding conductive materials B to a preheating temperature T1 in advance. That is to say, the corresponding micro heater 2 can be heated to a preheating temperature T1 in advance when the chip C is transferred to the two corresponding conductive materials B. Hence, after the chip C is transferred to the two corresponding conductive materials B, the corresponding micro heater 2 can be heated from the preheating temperature T1 (such as from a room temperature to 250° C.) to a maximum heating temperature T2 (such as from 200° C. to 400° C., so that the two corresponding conductive materials B can be melted completely or almost completely), so that the heating time of heating the two corresponding conductive materials B to a melted state can be effectively decreased (i.e., the time t1 from the start heating temperature T0 to the preheating temperature T1 can be saved), or the bonding time of bonding the chip C on the two corresponding conductive materials B can be effectively decreased. However, the aforementioned description is merely an example, and is not meant to limit the scope of the present disclosure.

3. When the chip C is transferred to the two corresponding conductive materials B, the micro heater control chip 3 can be configured to control the corresponding micro heater 2 to heat the two corresponding conductive materials B to a maximum heating temperature T2 (such as from 200° C. to 400° C., so that the two corresponding conductive materials B can be melted completely or almost completely) in advance. That is to say, the corresponding micro heater 2 can be heated to a maximum heating temperature T2 in advance when the chip C is transferred to the two corresponding conductive materials B. Hence, when the chip C is transferred to the two corresponding conductive materials B, the corresponding micro heater 2 has been melted completely or almost completely, so that the heating time of heating the two corresponding conductive materials B to a melted state can be effectively decreased (i.e., the time t2 from the start heating temperature T0 to the maximum heating temperature T2 can be saved), or the bonding time of bonding the chip C on the two corresponding conductive materials B can be effectively decreased. However, the aforementioned description is merely an example, and is not meant to limit the scope of the present disclosure.

4. When the chip C is transferred to the two corresponding conductive materials B, the micro heater control chip 3 can be configured to control the corresponding micro heater 2 to heat the two corresponding conductive materials B to a maximum heating temperature T2 (such as from 200° C. to 400° C., so that the two corresponding conductive materials B can be melted completely or almost completely) in advance, and then the two corresponding conductive materials B can be cooled from the maximum heating temperature T2 to a predetermined cooling temperature T3 (such as from 200° C. to 250° C.). That is to say, the corresponding micro heater 2 can be cooled from a maximum heating temperature T2 to a predetermined cooling temperature T3 in advance when the chip C is transferred to the two corresponding conductive materials B. Hence, when the chip C is transferred to the two corresponding conductive materials B, the corresponding micro heater 2 has been cooled as a semi-melted state that is still suitably configured for bonding the chip C), so that the cooling time of cooling the two corresponding conductive materials B can be effectively decreased (i.e., the time t3 from the start heating temperature T0 to the maximum heating temperature T2 and from the maximum heating temperature T2 to the predetermined cooling temperature T3 can be saved), or the bonding time of bonding the chip C on the two corresponding conductive materials B can be effectively decreased. However, the aforementioned description is merely an example, and is not meant to limit the scope of the present disclosure.

It should be noted that referring to FIG. 2 to FIG. 4, the first embodiment of the present disclosure further includes a chip-carrying structure Z that includes a circuit substrate 1 for carrying a plurality of conductive materials B, a plurality of micro heaters 2 disposed on or inside the circuit substrate 1, and a micro heater control chip 3 electrically connected to the micro heaters 2. More particularly, referring to FIG. 3 and FIG. 4, when a chip C is disposed on two corresponding ones of the conductive materials B, a system control module M3 can be configured to control the micro heater control chip 3 according to chip movement information N of the chip C, so that the micro heater control chip 3 (such as a CMOS control circuit 30) can be configured to control a corresponding one of the micro heaters 2 to start or stop heating the two corresponding conductive materials B according to the chip movement information N of the chip C.

Second Embodiment

Figure 6:
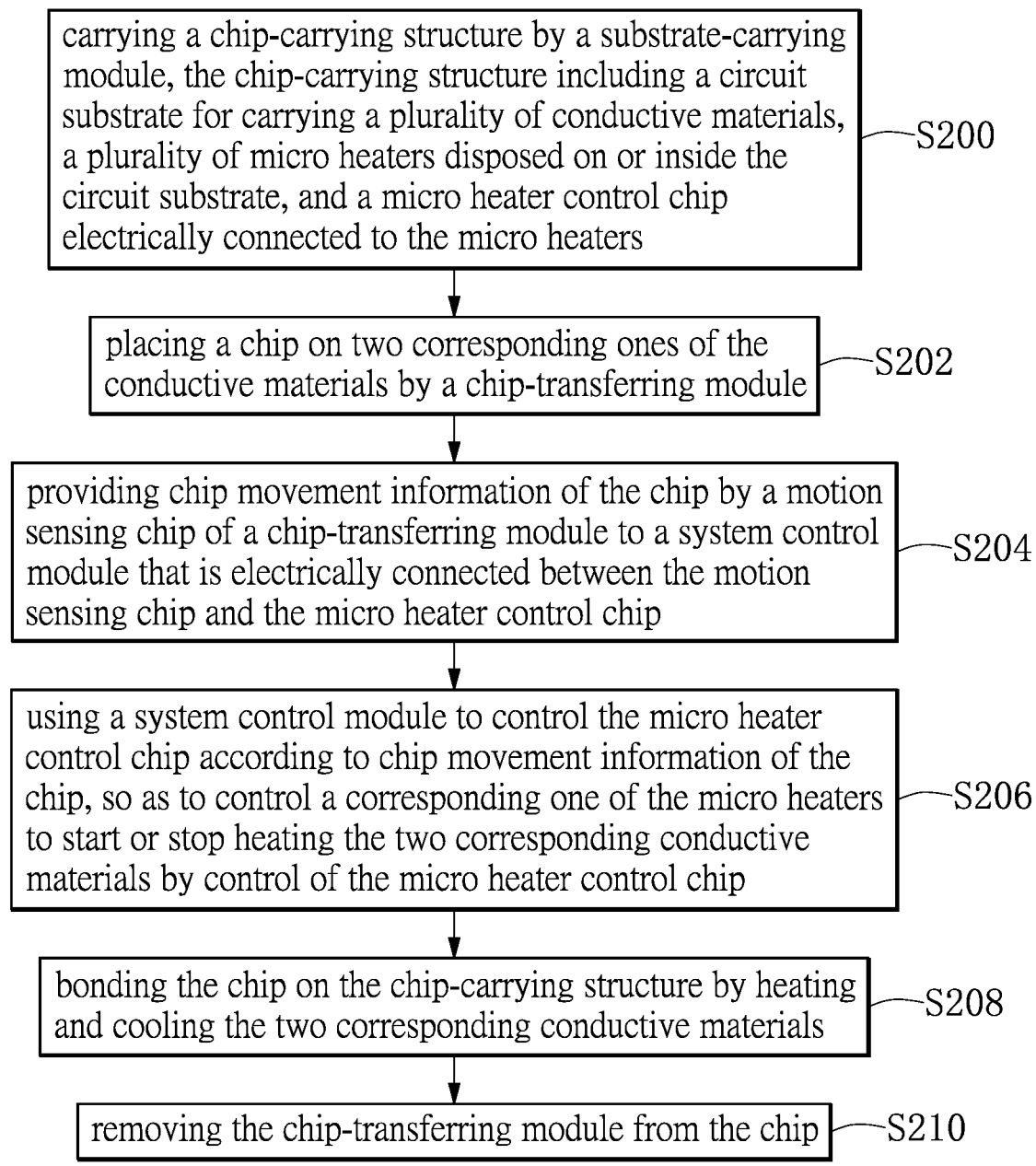
FIG. 6 is a flowchart of a chip-transferring method according to a second embodiment of the present disclosure.
Figure 7:
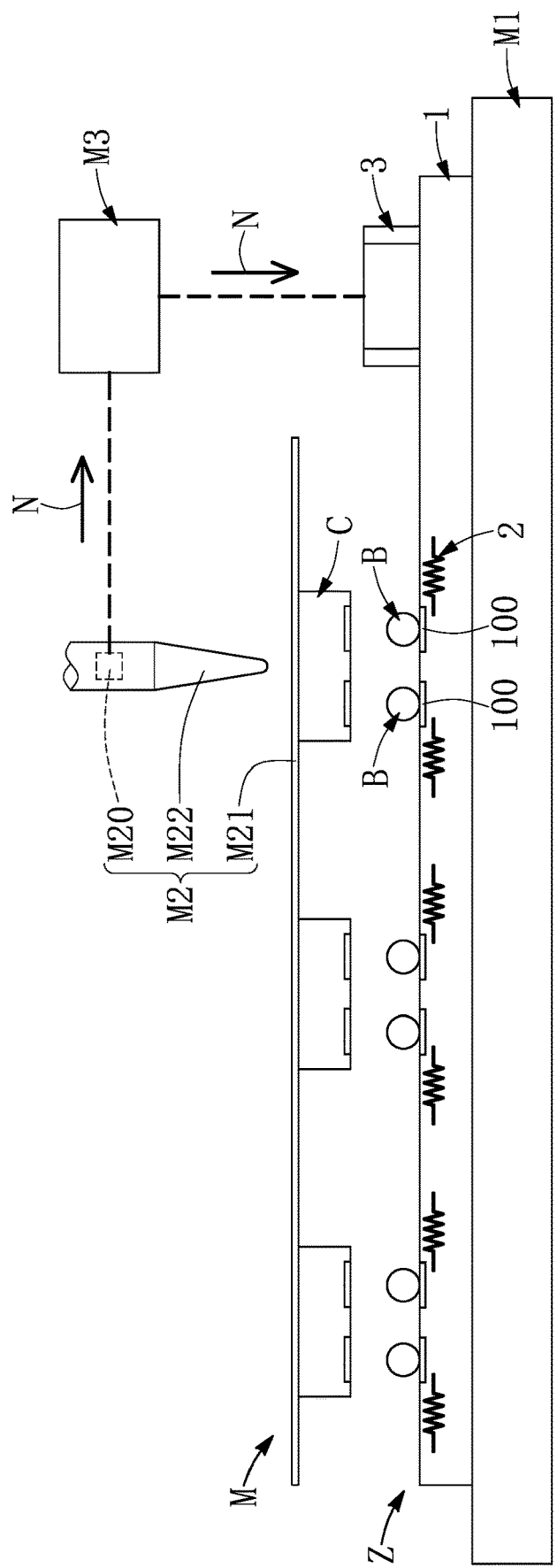
FIG. 7 is a schematic side view of a chip-transferring system according to the second embodiment of the present disclosure.
Figure 8:
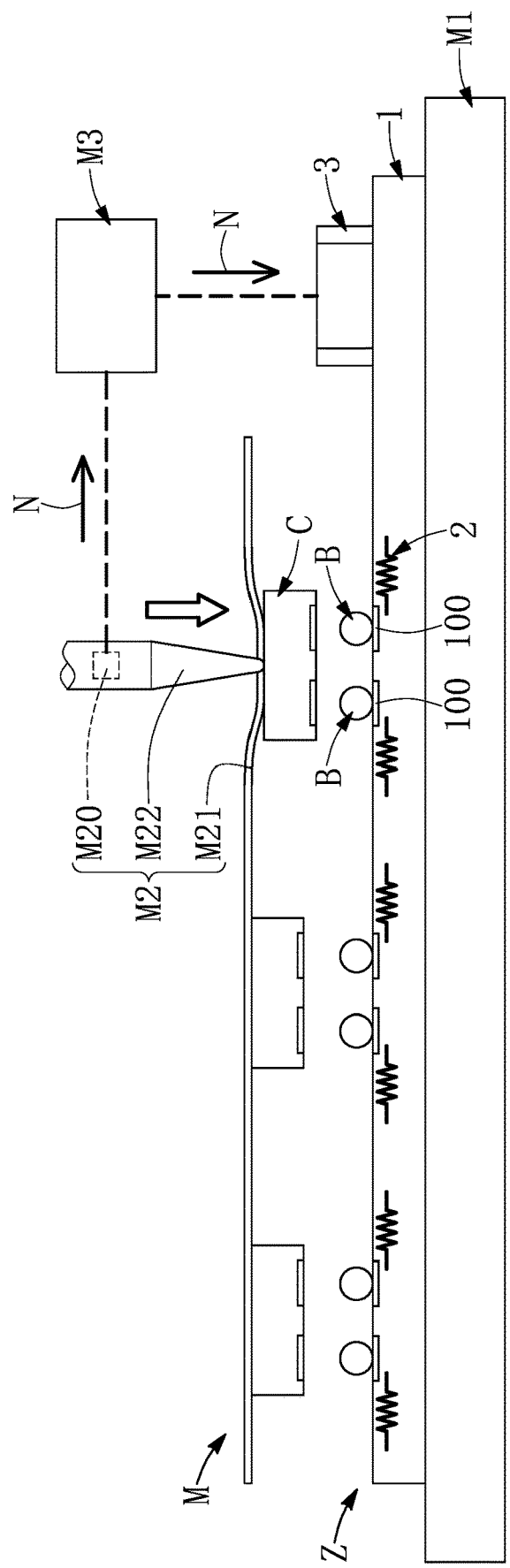
FIG. 8 is a schematic side view of a chip-pushing structure of the chip-transferring system indirectly contacting a chip according to the second embodiment of the present disclosure.
Figure 9:
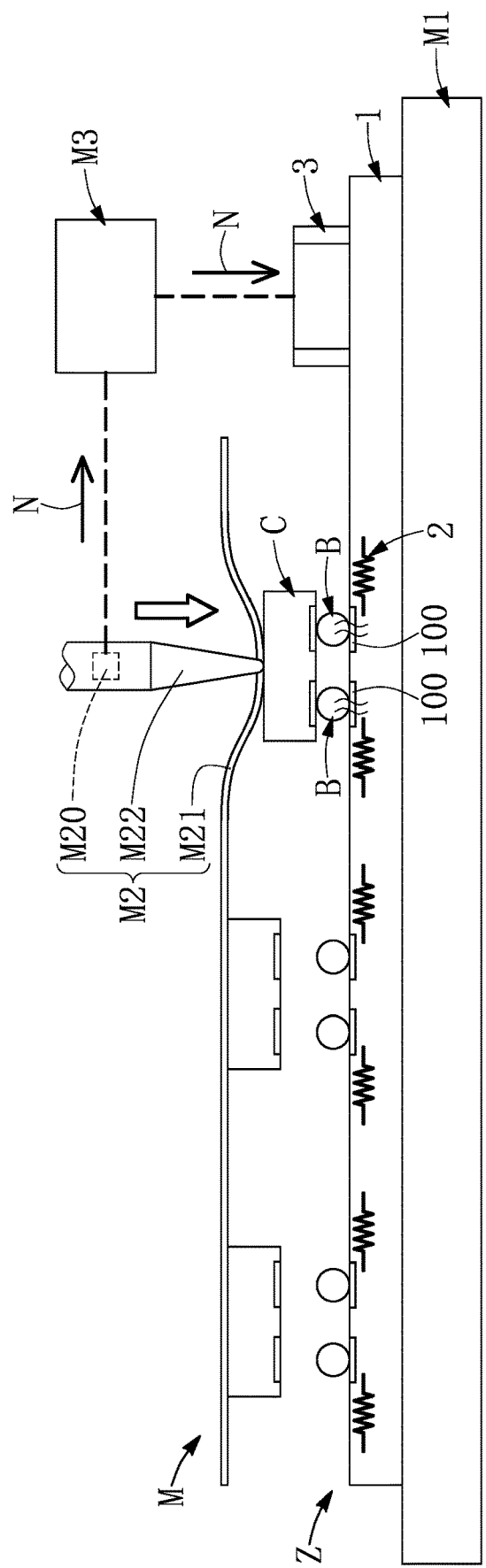
FIG. 9 is a schematic side view of the chip being transferred to two corresponding conductive materials by pushing of the chip-pushing structure according to the second embodiment of the present disclosure.
Figure 10:
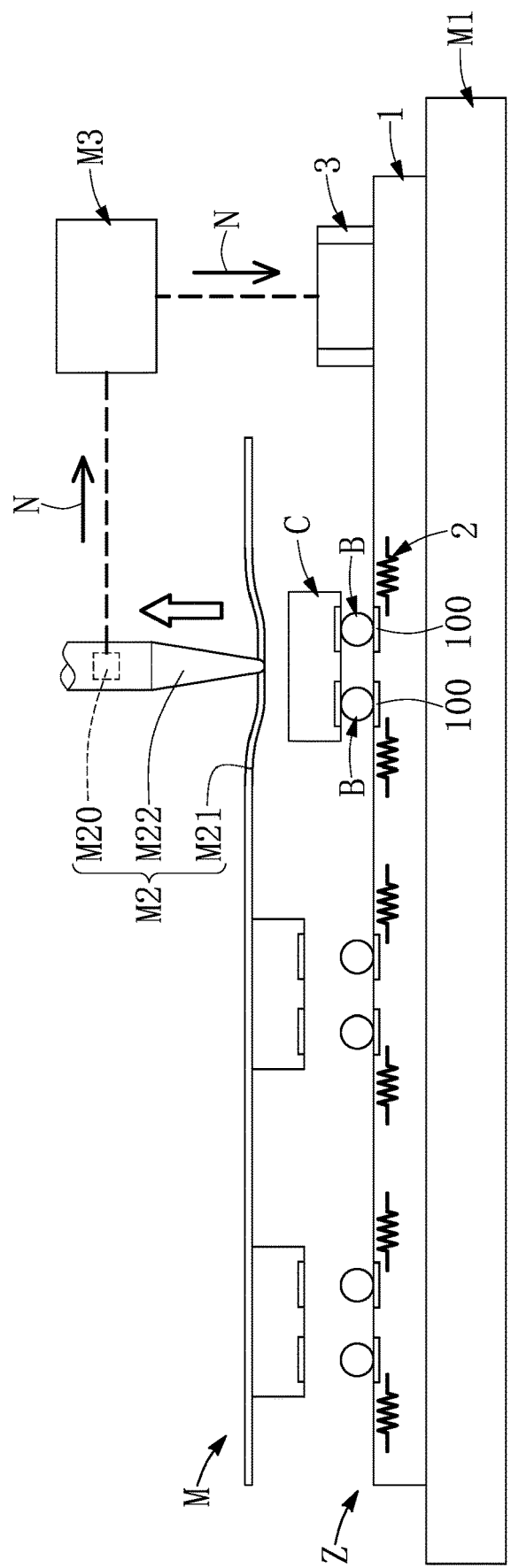
FIG. 10 is a schematic side view of a chip-transferring module being moved from the chip according to the second embodiment of the present disclosure.
Figure 11:
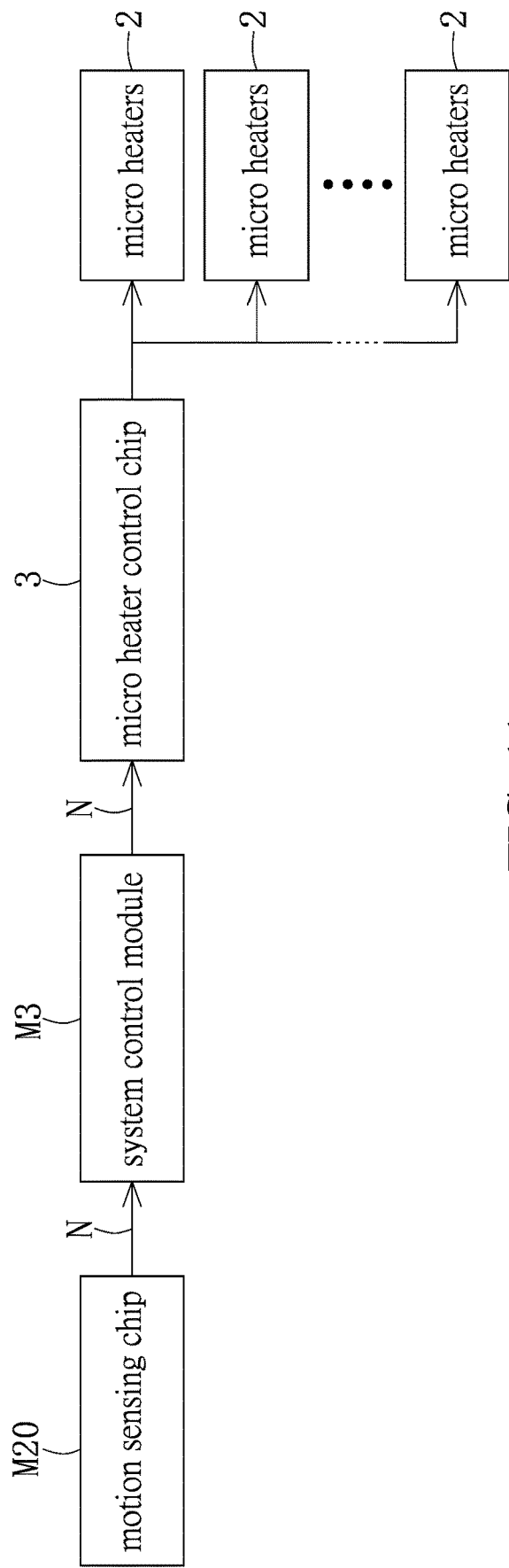
FIG. 11 is a functional block diagram of a motion sensing chip, a system control module, a micro heater control chip and a plurality of micro heaters of the chip-transferring system according to the second embodiment of the present disclosure.

Referring to FIG. 6 to FIG. 11, a second embodiment of the present disclosure provides a chip-transferring method including: firstly, referring to FIG. 6, FIG. 7 and FIG. 11, carrying a chip-carrying structure Z by a substrate-carrying module M1, the chip-carrying structure Z including a circuit substrate 1 for carrying a plurality of conductive materials B, a plurality of micro heaters 2 disposed on or inside the circuit substrate 1, and a micro heater control chip 3 electrically connected to the micro heaters 2 (step S200); next, referring to FIG. 6 to FIG. 9, placing a chip C on two corresponding ones of the conductive materials B by a chip-transferring module M2 (step S202); then, referring to FIG. 6, FIG. 9 and FIG. 11, providing chip movement information N (i.e., information about the chip C that has been moved) of the chip C by a motion sensing chip M20 of a chip-transferring module M2 to a system control module M3 that is electrically connected between the motion sensing chip M20 and the micro heater control chip 3 (step S204); afterwards, referring to FIG. 6, FIG. 8, FIG. 9 and FIG. 11, using a system control module M3 to control the micro heater control chip 3 according to chip movement information N of the chip C, so as to control a corresponding one of the micro heaters 2 to start or stop heating the two corresponding conductive materials B by control of the micro heater control chip 3 according to the chip movement information N of the chip C (step S206); next, referring to FIG. 6 and FIG. 9, bonding the chip C on the chip-carrying structure Z by heating and cooling (i.e., stop heating) the two corresponding conductive materials B (step S208); then, referring to FIG. 6 and FIG. 10, removing the chip-transferring module M2 from the chip C (step S210). For example, the chip-transferring module M2 includes a temporary chip-carrying structure M21 (such as a blue film or any film having an adhesive layer) for temporarily carrying the chip C, and a chip-pushing structure M22 (such as a push pin or an ultrasonic pin) for pushing the chip C, and the motion sensing chip M20 is disposed on the chip-pushing structure M22. In addition, in the step S202, the chip-pushing structure M22 can be configured to downwardly push the chip C so as to transfer the chip C onto the two corresponding conductive materials B (as shown in FIG. 9). Moreover, in the step S210, when the chip-pushing structure M22 of the chip-transferring module M2 is separated from the chip C, the temporary chip-carrying structure M21 of the chip-transferring module M2 can also be separated from the chip C (as shown in FIG. 10). However, the aforementioned description is merely an example, and is not meant to limit the scope of the present disclosure.

For example, as shown in FIG. 7, the circuit substrate 1 includes a plurality of conductive pads 100 for respectively carrying the conductive materials B, and each of the micro heaters 2 is adjacent to two corresponding ones of the conductive pads 100, so that two conductive materials B that are respectively disposed on the two corresponding conductive pads 100 can be heated by the corresponding micro heater 2. In addition, the conductive material B can be a solder ball, solder paste or any other kind of solder material, and the chip C can be a light-emitting diode (LED) chip or an integrated circuit (IC) chip. However, the aforementioned description is merely an example, and is not meant to limit the scope of the present disclosure.

For example, referring to FIG. 4, FIG. 7 and FIG. 11, the micro heater control chip 3 includes a plurality of complementary metal-oxide-semiconductor (CMOS) control circuits 30 respectively and electrically connected to the micro heaters 2, and the CMOS control circuit 30 has a source S, a drain D, and a gate G. In addition, each of the micro heaters 2 can be turned on (i.e., the current can pass through the micro heater 2) to heat the two corresponding conductive materials B by a corresponding one of the CMOS control circuits 30, or can be turned off (i.e., the current cannot pass through the micro heater 2) to cool the two corresponding conductive materials B by a corresponding one of the CMOS control circuits 30. That is to say, each of the CMOS control circuits 30 can be configured to control the micro heater control chip 3 to determine whether the current can pass through the corresponding micro heater 2. When the CMOS control circuit 30 is turned on, the current can pass through the CMOS control circuit 30 and transmit to the corresponding micro heater 2, so that the corresponding micro heater 2 can be turned on (can be heated) so as to heat the two corresponding conductive materials B. When the CMOS control circuit 30 is turned off, the current cannot pass through the CMOS control circuit 30 and transmit to the corresponding micro heater 2, so that the corresponding micro heater 2 can be turned off (cannot be heated) so as to cool the two corresponding conductive materials B. However, the aforementioned description is merely an example, and is not meant to limit the scope of the present disclosure.

For example, as shown in FIG. 7 to FIG. 11, the system control module M3 can be configured to control the micro heater control chip 3 to turn on or turn off the micro heater 2 (or turn on or turn off the micro heaters 2 individually) according to the chip movement information N of the chip C (or the module movement information of the chip-transferring module M2). That is to say, when the system control module M3 is configured to control the micro heater control chip 3 to turn on the micro heater 2 according to the chip movement information N (the chip movement information N is a signal generated after moving the chip C) of the chip C, the micro heater 2 can be configured to start heating the two corresponding conductive materials B. When the system control module M3 is configured to control the micro heater control chip 3 to turn off the micro heater 2 according to the chip movement information N (the chip movement information N is a signal generated after moving the chip C) of the chip C, the micro heater 2 can be configured to stop heating the two corresponding conductive materials B so as to cool the two corresponding conductive materials B. It should be noted that each of the micro heaters 2 has a predetermined resistance value (a predetermined impedance value), and a working current or a working voltage (or the working current and the working voltage) received by the micro heater 2 can be adjusted by the micro heater control chip 3 according to the predetermined resistance value of the micro heater 2, so that heating temperatures (or heating effects) respectively provided by the micro heaters 2 are the same. Alternatively, the micro heater control chip 3 can be configured to control the micro heater 2 to provide a predetermined heating temperature or heating effect. However, the aforementioned description is merely an example, and is not meant to limit the scope of the present disclosure.

For example, referring to FIG. 5, FIG. 9 and FIG. 11, the micro heater 2 can provide different heating or cooling embodiments as follows:

1. When the chip C is transferred from the temporary chip-carrying structure M21 to the two corresponding conductive materials B by pushing of the chip-pushing structure M22, the micro heater control chip 3 can be configured to control the corresponding micro heater 2 to start heating the two corresponding conductive materials B. That is to say, the corresponding micro heater 2 can be heated simultaneously from a start heating temperature $T0$ when the chip C is transferred to the two corresponding conductive materials B, so that the two corresponding conductive materials B are heated from the start heating temperature $T0$ (such as 0° C.). However, the aforementioned description is merely an example, and is not meant to limit the scope of the present disclosure.

2. When the chip C is transferred from the temporary chip-carrying structure M21 to the two corresponding conductive materials B by pushing of the chip-pushing structure M22, the micro heater control chip 3 can be configured to control the corresponding micro heater 2 to heat the two corresponding conductive materials B to a preheating temperature $T1$ in advance. That is to say, the corresponding micro heater 2 can be heated to a preheating temperature $T1$ in advance when the chip C is transferred to the two corresponding conductive materials B. Hence, after the chip C is transferred to the two corresponding conductive materials B, the corresponding micro heater 2 can be heated from the preheating temperature $T1$ (such as from a room temperature to 250° C.) to a maximum heating temperature $T2$ (such as from 200° C. to 400° C., so that the two corresponding conductive materials B can be melted completely or almost completely), so that the heating time of heating the two corresponding conductive materials B to a melted state can be effectively decreased (i.e., the time $t1$ from the start heating temperature $T0$ to the preheating temperature $T1$ can be saved), or the bonding time of bonding the chip C on the two corresponding conductive materials B can be effectively decreased. However, the aforementioned description is merely an example, and is not meant to limit the scope of the present disclosure.

3. When the chip C is transferred from the temporary chip-carrying structure M21 to the two corresponding conductive materials B by pushing of the chip-pushing structure M22, the micro heater control chip 3 can be configured to control the corresponding micro heater 2 to heat the two corresponding conductive materials B to a maximum heating temperature $T2$ (such as from 200° C. to 400° C., so that the two corresponding conductive materials B can be melted completely or almost completely) in advance. That is to say, the corresponding micro heater 2 can be heated to a maximum heating temperature $T2$ in advance when the chip C is transferred to the two corresponding conductive materials B. Hence, when the chip C is transferred to the two corresponding conductive materials B, the corresponding micro heater 2 has been melted completely or almost completely, so that the heating time of heating the two corresponding conductive materials B to a melted state can be effectively decreased (i.e., the time $t2$ from the start heating temperature $T0$ to the maximum heating temperature $T2$ can be saved), or the bonding time of bonding the chip C on the two corresponding conductive materials B can be effectively decreased. However, the aforementioned description is merely an example, and is not meant to limit the scope of the present disclosure.

4. When the chip C is transferred from the temporary chip-carrying structure M21 to the two corresponding conductive materials B by pushing of the chip-pushing structure M22, the micro heater control chip 3 can be configured to control the corresponding micro heater 2 to heat the two corresponding conductive materials B to a maximum heating temperature $T2$ (such as from 200° C. to 400° C., so that the two corresponding conductive materials B can be melted completely or almost completely) in advance, and then the two corresponding conductive materials B can be cooled from the maximum heating temperature $T2$ to a predetermined cooling temperature $T3$ (such as from 200° C. to 250° C.). That is to say, the corresponding micro heater 2 can be cooled from a maximum heating temperature $T2$ to a predetermined cooling temperature $T3$ in advance when the chip C is transferred to the two corresponding conductive materials B. Hence, when the chip C is transferred to the two corresponding conductive materials B, the corresponding micro heater 2 has been cooled as a semi-melted state that is still suitably configured for bonding the chip C), so that the cooling time of cooling the two corresponding conductive materials B can be effectively decreased (i.e., the time t3 from the start heating temperature T0 to the maximum heating temperature T2 and from the maximum heating temperature T2 to the predetermined cooling temperature T3 can be saved), or the bonding time of bonding the chip C on the two corresponding conductive materials B can be effectively decreased. However, the aforementioned description is merely an example, and is not meant to limit the scope of the present disclosure.

It should be noted that as shown in FIG. 7, the second embodiment of the present disclosure further includes a chip-transferring system M, which includes a substrate-carrying module M1, a chip-transferring module M2, and a system control module M3. More particularly, the substrate-carrying module M1 is configured for carrying a chip-carrying structure Z, and the chip-carrying structure Z includes a circuit substrate 1 for carrying a plurality of conductive materials B, a plurality of micro heaters 2 disposed on or inside the circuit substrate 1, and a micro heater control chip 3 electrically connected to the micro heaters 2. The chip-transferring module M2 is disposed above (as shown in FIG. 7) or under (as shown in an upside-down view of FIG. 7) the substrate-carrying module M1 for transferring a chip C onto two corresponding ones of the conductive materials B, and the chip-transferring module M2 includes a motion sensing chip M20. The system control module M3 is electrically connected between the motion sensing chip M20 and the micro heater control chip 3. Therefore, when chip movement information N of the chip C that is provided by the motion sensing chip M20 of the chip-transferring module M2 is transmitted to the system control module M3, the system control module M3 can be configured to control the micro heater control chip 3 according to the chip movement information N of the chip C, so that the micro heater control chip 3 can be configured to control a corresponding one of the micro heaters 2 to start or stop heating the two corresponding conductive materials B by control of the system control module M3 according to the chip movement information N of the chip C.

Third Embodiment

Figure 12:
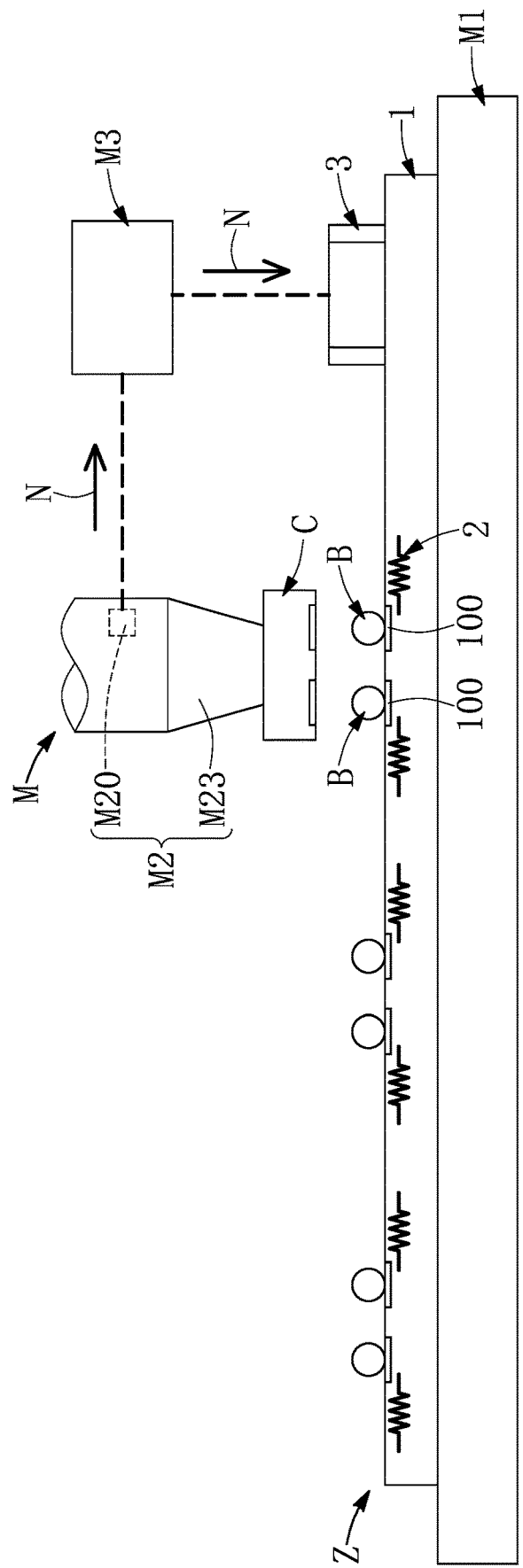
FIG. 12 is a schematic side view of a chip-transferring system according to a third embodiment of the present disclosure.
Figure 13:
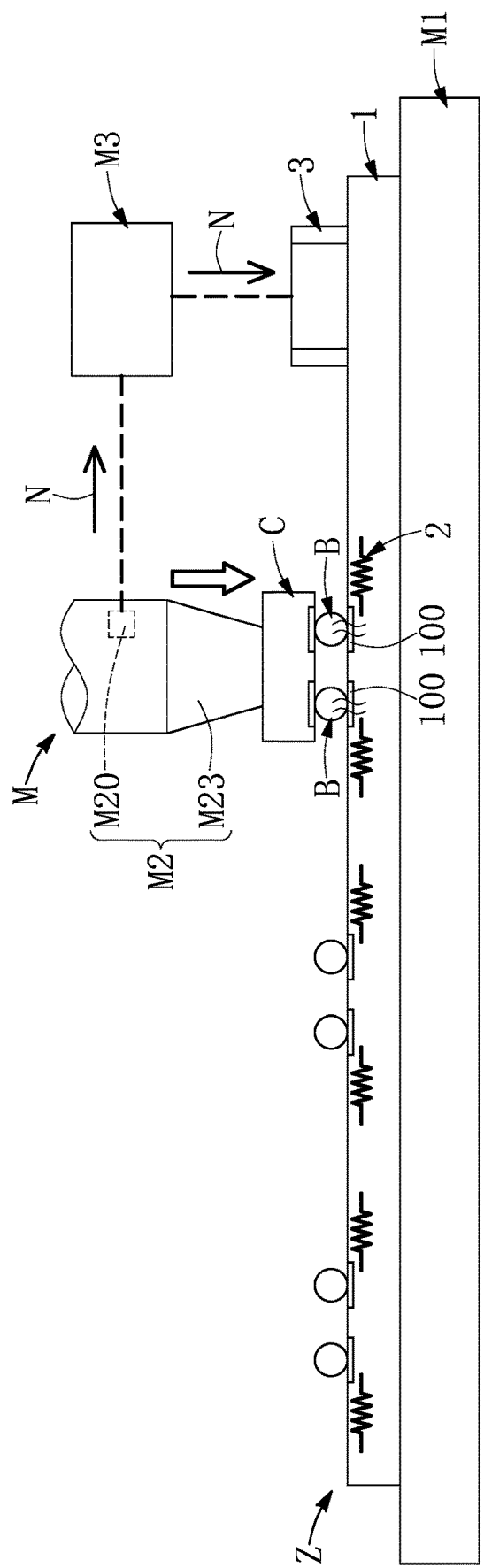
FIG. 13 is a schematic side view of a chip being transferred to two corresponding conductive materials by suctioning and moving of a chip-suction structure according to the third embodiment of the present disclosure.
Figure 14:
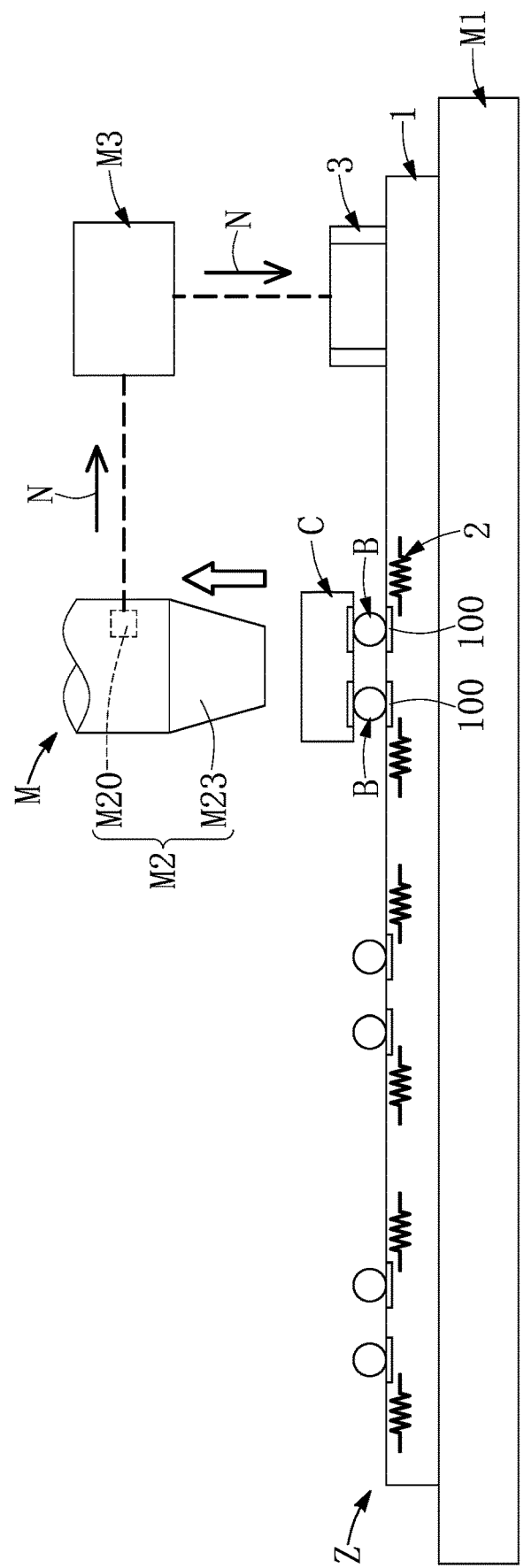
FIG. 14 is a schematic side view of a chip-transferring module being moved from the chip according to the third embodiment of the present disclosure.

Referring to FIG. 12 to FIG. 14, a third embodiment of the present disclosure provides a chip-transferring system M and a chip-transferring method. Comparing FIG. 12 with FIG. 7, comparing FIG. 13 with FIG. 9, and comparing FIG. 14 with FIG. 10, the biggest difference between the third embodiment and the second embodiment is as follows: in the chip-transferring system M of the third embodiment, the chip-transferring module M2 includes a chip-suction structure M23 for suctioning the chip C, the motion sensing chip M20 is disposed on the chip-suction structure M23. In addition, referring to FIG. 12 and FIG. 13, in the chip-transferring method of the third embodiment, the chip C can be transferred to two corresponding conductive materials B by suctioning of the chip-suction structure M23 of the chip-transferring module M2 (that is to say, the chip-suction structure M23 can be configured to suction and move the chip C so as to transfer the chip C onto the two corresponding conductive materials B). Moreover, as shown in FIG. 14, in the chip-transferring method of the third embodiment, the chip-suction structure M23 of the chip-transferring module M2 can move from the chip C, after the chip C is transferred to the two corresponding conductive materials B. However, the aforementioned description is merely an example, and is not meant to limit the scope of the present disclosure.

Beneficial Effects of the Embodiments

In conclusion, in the chip-transferring system M provided by the present disclosure, by virtue of "the substrate-carrying module M1 being configured for carrying a chip-carrying structure Z, and the chip-carrying structure Z including a plurality of micro heaters 2, and a micro heater control chip 3 electrically connected to the micro heaters 2", "the chip-transferring module M2 including a motion sensing chip M20" and "the system control module M3 being electrically connected between the motion sensing chip M20 and the micro heater control chip 3", the micro heater control chip 3 can be configured to control a corresponding one of the micro heaters 2 to start or stop heating two corresponding conductive materials B.

Furthermore, in the chip-transferring method provided by the present disclosure, by virtue of "carrying a chip-carrying structure Z, in which the chip-carrying structure Z includes a circuit substrate 1 for carrying a plurality of conductive materials B, a plurality of micro heaters 2 disposed on or inside the circuit substrate 1, and a micro heater control chip 3 electrically connected to the micro heaters 2", "placing a chip C on two corresponding ones of the conductive materials B", "providing chip movement information N of the chip C" and "controlling a corresponding one of the micro heaters 2 by the micro heater control chip 3 according to the chip movement information N of the chip C", the micro heater control chip 3 can be configured to control the corresponding micro heater 2 to start or stop heating the two corresponding conductive materials B according to the chip movement information N of the chip C.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip-transferring system for transferring a chip onto a chip-carrying structure, wherein the chip-carrying structure includes a circuit substrate, a plurality of micro heaters disposed on or inside the circuit substrate, and a micro heater control chip electrically connected to the micro heaters, the chip-transferring system comprising:
 a substrate-carrying module for carrying the chip-carrying structure;
 a chip-transferring module disposed above or under the substrate-carrying module for transferring the chip onto two corresponding ones of a plurality of conductive materials carried on the circuit substrate of the chip-carrying structure, wherein the chip-transferring module includes a motion sensing chip; and a system control module configured to be electrically connected between the motion sensing chip and the micro heater control chip;

wherein, when chip movement information of the chip that is provided by the motion sensing chip of the chip-transferring module is transmitted to the system control module, the system control module is configured to control the micro heater control chip to control a corresponding one of the micro heaters to start or stop heating the two corresponding conductive materials according to the chip movement information of the chip, wherein the micro heater control chip includes a plurality of CMOS control circuits respectively and electrically connected to the micro heaters, and each of the micro heaters is turned on to heat the two corresponding conductive materials, or turned off to cool the two corresponding conductive materials by a corresponding one of the CMOS control circuits.

2. The chip-transferring system according to claim 1, wherein the chip-transferring module includes a temporary chip-carrying structure comprising a blue film or a film having an adhesive layer for temporarily carrying the chip, and a chip-pushing structure comprising a push pin or an ultrasonic pin for pushing the chip, the motion sensing chip is disposed on the chip-pushing structure, and the chip-pushing structure is configured to push the chip so as to transfer the chip onto the two corresponding conductive materials.

3. The chip-transferring system according to claim 1, wherein the chip-transferring module includes a chip-suction structure for suctioning the chip, the motion sensing chip is disposed on the chip-suction structure, and the chip-suction structure is configured to suction and move the chip so as to transfer the chip onto the two corresponding conductive materials.

4. The chip-transferring system according to claim 1, wherein the circuit substrate includes a plurality of conductive pads for respectively carrying the conductive materials, and each of the micro heaters is adjacent to two corresponding ones of the conductive pads.

5. The chip-transferring system according to claim 1, wherein each of the micro heaters has a predetermined resistance value, and a working current or a working voltage received by the micro heater is adjusted by the micro heater control chip according to the predetermined resistance value of the micro heat, so that heating temperatures respectively provided by the micro heaters are the same.

6. A chip-transferring system for transferring a chip onto a chip-carrying structure, wherein the chip-carrying structure includes a plurality of micro heaters, and a micro heater control chip electrically connected to the micro heaters, the chip-transferring system comprising:

a substrate-carrying module for carrying the chip-carrying structure;

a chip-transferring module including a motion sensing chip; and a system control module configured to be electrically connected between the motion sensing chip and the micro heater control chip, wherein the micro heater control chip includes a plurality of CMOS control circuits respectively and electrically connected to the micro heaters, and each of the micro heaters is turned on to heat two corresponding conductive materials, or turned off to cool the two corresponding conductive materials by a corresponding one of the CMOS control circuits.

7. The chip-transferring system according to claim 6, wherein the chip-transferring module includes a temporary chip-carrying structure comprising a blue film or a film having an adhesive layer for temporarily carrying a chip, and a chip-pushing structure comprising a push pin or an ultrasonic pin for pushing the chip, the motion sensing chip is disposed on the chip-pushing structure, and the chip-pushing structure is configured to push the chip so as to transfer the chip onto two corresponding conductive materials.

8. The chip-transferring system according to claim 6, wherein the chip-transferring module includes a chip-suction structure for suctioning a chip, the motion sensing chip is disposed on the chip-suction structure, and the chip-suction structure is configured to suction and move the chip so as to transfer the chip onto two corresponding conductive materials.

9. The chip-transferring system according to claim 6, wherein each of the micro heaters has a predetermined resistance value, and a working current or a working voltage received by the micro heater is adjusted by the micro heater control chip according to the predetermined resistance value of the micro heat, so that heating temperatures respectively provided by the micro heaters are the same.

* * * * *